United States Patent [19]

Shimozato et al.

[11] Patent Number: 4,655,168

[45] Date of Patent: Apr. 7, 1987

[54] CONTINUOUS VACUUM DEPOSITION APPARATUS WITH CONTROL PANELS FOR REGULATING WIDTH OF VAPOR FLOW

[75] Inventors: Yoshio Shimozato; Tetsuyoshi Wada; Kenichi Yanagi; Mitsuo Kato; Heizaburo Furukawa; Kanji Wake, all of Hiroshima; Arihiko Morita, Sakai; Norio Tsukiji, Sakai; Takuya Aiko, Sakai; Toshiharu Kittaka, Sakai; Yasuji Nakanishi, Sakai, all of Japan

[73] Assignees: Nisshin Steel Co., Ltd.; Mitsubishi Jukogyo Kabushiki Kaisha, both of Tokyo, Japan

[21] Appl. No.: 774,290

[22] Filed: Sep. 10, 1985

[30] Foreign Application Priority Data

Sep. 17, 1984 [JP] Japan ................................. 59-192575

[51] Int. Cl.[4] ............................................. C23C 13/10

[52] U.S. Cl. ..................................... 118/718; 118/720; 118/728; 118/729; 118/733; 427/255.5

[58] Field of Search ..................... 427/255.5; 118/718, 118/720, 728, 729, 733

[56] References Cited

U.S. PATENT DOCUMENTS

| | | | |
|---|---|---|---|
| 3,989,862 | 11/1976 | Butler | 118/718 |
| 4,220,117 | 9/1980 | Shinohara | 118/718 |
| 4,446,816 | 5/1984 | Kitamoto | 118/718 |
| 4,478,878 | 10/1984 | Neuwald | 118/718 |

Primary Examiner—Richard Bueker
Attorney, Agent, or Firm—Webb, Burden, Robinson & Webb

[57] ABSTRACT

A continuous vacuum deposition apparatus for coating a metal strip in which a control means for changing the width of the metal vapor channel so that strips of various widths can be deposition-coated with transversally uniform thickness distribution is disclosed.

6 Claims, 14 Drawing Figures

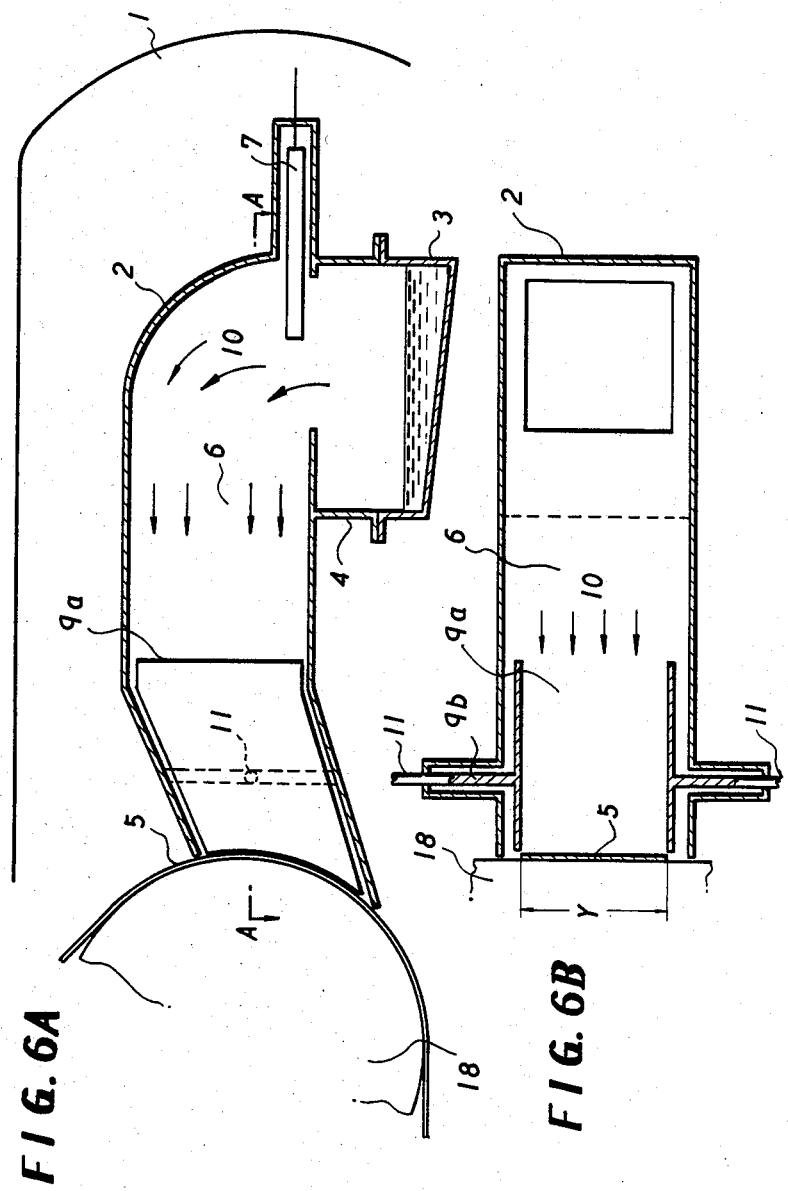

CONTINUOUS VACUUM DEPOSITION APPARATUS WITH CONTROL PANELS FOR REGULATING WIDTH OF VAPOR FLOW

FIELD OF THE INVENTION

This invention relates to an improved vacuum deposition apparatus for coating the surface of a metal strip with another metal.

BACKGROUND OF THE INVENTION

A continuous vacuum deposition coating apparatus for coating the surface of a metal strip with another metal, a steel strip with zinc for instance is known. This apparatus comprises an evacuable vacuum deposition chamber in which an evaporation chamber is place and the entrance and the outlet of said vacuum deposition chamber is closed by a seal roll means which allow entering and egressing of the metal strip while maintaining vacuum condition of the chamber. Such apparatus is typically disclosed in Japanese Patent Publication No. 18646/72, No. 20950178, etc., for instance.

In known vacuum deposition apparatuses, the evaporation chamber is provided with a vapor channel of constant dimension. Therefore, there was a defect that when a metal strip the width of which is narrower than the width of the channel is coated, the strip is not coated to a uniform thickness over the whole width thereof. We have devised a new continuous vacuum deposition apparatus which can provide a coating with transversally uniform thickness.

DISCLOSURE OF THE INVENTION

This invention provides a continuous vacuum deposition apparatus for coating a metal strip which comprises an evacuable deposition chamber provided with a seal roll system at the entrance and the exit for entering and egressing of the strip and an evaporation chamber which is placed in said evacuable deposition chamber and comprises an evaporation bath and a vapor channel which leads the vapor to the surface of the substrate strip, wherein a pair of control panels for varying the width of vapor flow are provided in said vapor channel adjacent to the substrate strip.

The apparatus of this invention can be constructed by those skilled in the art by referring to the prior art references and the detailed explanation of the invention described below, and necessary or desirable modifications can be effected within the scope of the patent claims appended hereto.

The invention will now be described in detail with reference to the attached drawings.

BRIEF DESCRIPTION OF THE DRAWINGS

FIG. 6A is a schematic vertical cross-sectional view of an embodiment of the apparatus of this invention and FIG. 6B is a horizontal cross-sectional view along line A-A' in FIG. 6A;

SPECIFIC DESCRIPTION OF THE INVENTION

Figures 1, 2:
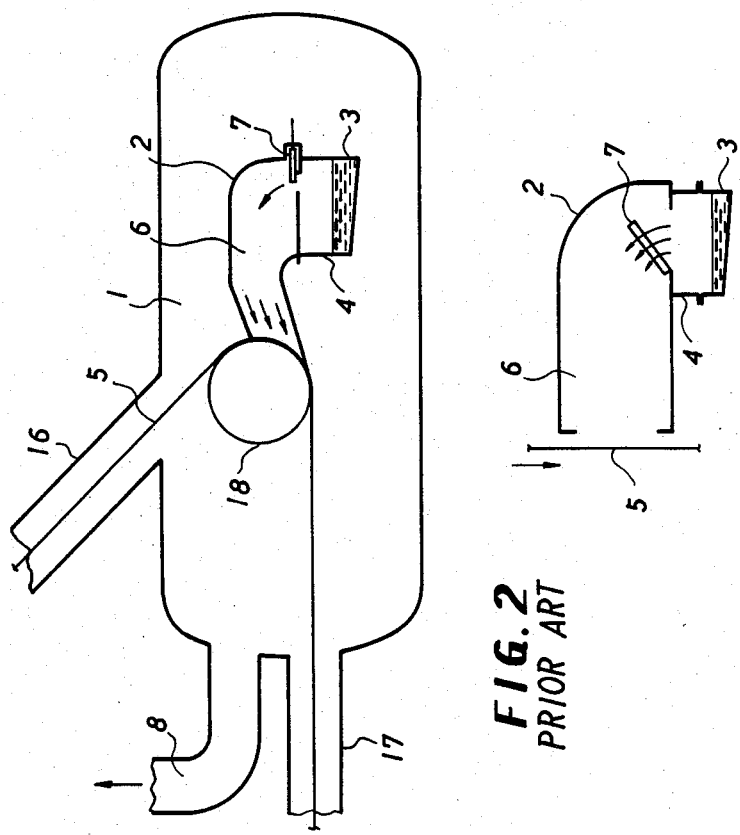
FIG. 1 is a schematic vertical cross-sectional view of an example of the conventional continuous vacuum deposition apparatus.
FIG. 2 is a partial schematic vertical cross-sectional view of another example of the conventional continuous vacuum deposition apparatus.

The conventional vacuum deposition apparatus illustrated in FIG. 1 comprises a vacuum deposition chamber 1, and an evaporation chamber 2 placed in the former. The vacuum deposition chamber 1 is provided with an inlet channel 16, an outlet channel 17, an exhaust duct 8 and a guide roll 18 for a substrate metal strip 5, and can be evacuated by a vacuum pump means (not shown) through the exhaust duct 8. The openings of the inlet channel 16 and the outlet channel 17 are respectively provided with a seal roll system (not shown) which allows, respectively, introduction and egress of the metal strip into and from the vacuum deposition chamber 1 while maintaining the vacuum of the chamber. The seal roll system is known per se and disclosed in Japanese Patent Publication No. 18646/72 and 20950/78, etc., for instance.

The evaporation chamber 2 comprises a melt bath 4, and a vapor channel 6 and is provided with a heater means (not specifically shown), and a shutter means 7, etc. A metal 3 is melted and evaporated in the bath 4 and is replenished from outside of the vacuum deposition chamber by means of a device not specifically shown. The vapor passes through the vapor channel 6 to an opening thereof, where it is deposited onto the surface of the substrate strip which moves past the opening of the channel. The flow rate or evaporation rate of the metal vapor to be deposited is controlled by regulating electric power supplied to the electric heater means in the bath 4 and the aperture of a shutter 7.

The deposition chamber 1 is usually maintained at a pressure lower than the pressure in the evaporation chamber 2, and the pressure is controlled by a vacuum pump means (not shown) and an inert has being let in. In the conventional apparatus, however, the pressure inside the vacuum deposition chamber 1 is kept constant regardless of deposition amount or vapor flow rate. (To regulate the pressure inside of the vacuum deposition chamber is a theme of the copending Application Ser. No. 740,553). All parts of the apparatus are heatable to a temperature higher than the sublimation temperature of the metal to be deposited in order to avoid deposition of the metal thereon.

In addition to the apparatus as illustrated in FIG. 1, another type of apparatus as shown in FIG. 2, in which the substrate metal strip vertically passes the opening of the vapor channel 6 and the shutter 7 is of the butterfly type and is also known in the prior art. In FIG. 2, the reference numbers stand for the same members as in FIG. 1 and the other members are omitted.

Figure 3:
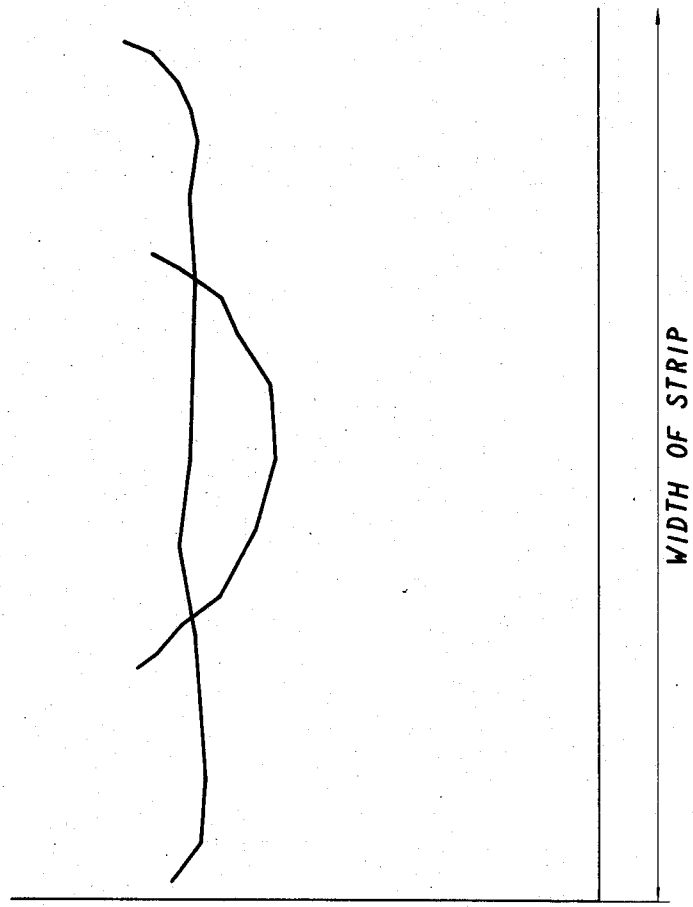
FIG. 3 is a graph showing thickness distribution in deposition-coated films formed by a conventional continuous vacuum deposition apparatus.

When a substrate metal strip the width of which is narrower than the width of the vapor channel is coated with the above-described conventional vacuum deposition apparatus, the formed vacuum deposition coating is usually irregular in the transverse thickness distribution as shown in FIG. 3.

Figure 4:
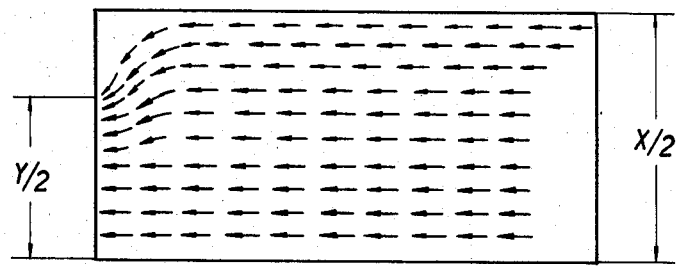
FIG. 4 is a schematic horizontal view of vapor flow in the vapor channel of a conventional apparatus.

Such transversally non-uniform deposition is caused by various parameters. In the apparatus of FIG. 1, the supporting roll 18 is heated to a temperature higher than the sublimation temperature of the metal to be deposited to avoid the deposition of the metal thereon as well as the other members and the inside wall of the vacuum deposition chamber as mentioned above. Therefore, when a substrate strip is coated, the newly introduced substrate strip is coated by the deposition of the metal vapor although the other parts are not coated because the strip is not yet heated to a temperature higher than the sublimation temperature of the metal to be deposited. When a substrate strip the width of which is narrower than the width of the supporting roll 18 or the vapor channel 6 is coated, the metal vapor which comes near to the supporting roll surface not covered by the substrate strip does not deposit thereon but moves sideward to raise the vapor density in the vicinity of the strip edges as shown in FIG. 4. FIG. 4 represents the horizontal cross section of the vapor channel. The bottom line stands for the median line, X stands for the width of the channel or the supporting roll and Y stands for the width of the strip. The vapor flow contracts in the vicinity of the substrate.

Figure 5A:
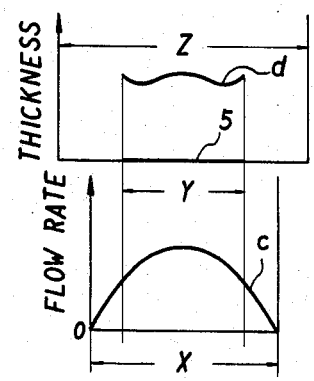
FIG. 5A and 5B are schematic representations of vapor flow rate distribution in the vapor channel and thickness distribution in the formed coating film when a conventional apparatus is used.
Figure 5B:
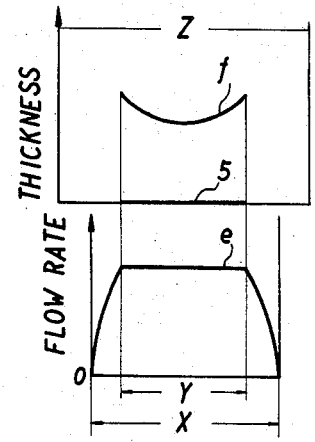

Also the metal vapor flow per se is not uniform because of the viscosity of the vapor and the influence of the side walls of the vapor channel as shown in FIGS. 5A and 5B. In FIGS. 5A and 5B, the distance X stands for the horizontal width of the vapor channel 6, the distance Y stands for the width of the metal strip to be coated and the distance Z stands for width of the supporting roll 18. FIG. 5A illustrates the flow rate distribution of the metal vapor and the transverse thickness distribution of the coated film when the flow rate (evaporation rate) of the metal vapor is rather low. In this case, the influence of the side walls of the vapor channel is great and the deceleration effect of the side walls and the vapor viscosity reached the median part of the vapor flow, and thus the flow rate distribution is represented by curve c. And the transverse thickness distribution of the deposited film caused by the effects of the above-mentioned flow rate distribution and the temperature difference between the roll surface and the strip is represented by curve d.

FIG. 5B illustrates the flow rate distribution of the metal vapor and the transverse thickness distribution of the coated film when the flow rate (evaporation rate) of the metal vapor is rather high. In this case, the influence of the side walls of the vapor channel is small and the deceleration effect of the side walls and the viscosity of the metal vapor does not reach the median part but only rather narrow side portions are influenced and a uniform flow rate is maintained for the most part of the flow. The transverse thickness distribution of the deposited film in this case is represented by curve f. The flow rate distribution is represented by curve e.

The above-described defect of the known vacuum deposition apparatus can be overcome by providing an apparatus which is provided with a control means which can optionally change the width of the vapor channel in accordance with the width of the substrate metal strip to be coated and the vapor flow rate or the evaporation rate.

The apparatus of the present invention illustrated in FIG. 6A and FIG. 6B as an embodiment thereof is constructed substantially in the same way as the apparatus of FIG. 1 excepting that a pair of vapor flow width regulating means are provided. That is, the apparatus comprises a vacuum deposition chamber 1 and an evaporation chamber 2 placed in the former. A metal to be deposited is evaporated from the surface of a molten bath 3 in the evaporation bath 4 and passes through the vapor channel 6 to the opening thereof. Needless to say, the deposition chamber is evacuated by a pump means not shown. Usually the pressure in the evaporation chamber is almost the same level as that in the vacuum deposition chamber 1 or a slightly higher level.

At the opening of the vapor channel 1, a pair of control panels 9 are provided. A control panel 9 comprises a lateral board 9a and an intercepting board 9b, to which an operating rod 11 driven by a driving means placed outside is connected. Although the structure is schematically shown in FIGS. 6A and 6B, needless to say, the control panel 9 is constructed so that the metal vapor does not leak from the interstices between the control panel and the channel wall.

In FIG. 6B, which is a horizontal cross section along line A-A' in FIG. 6A, Y stands for the width of the substrate metal strip.

Figure 7A:
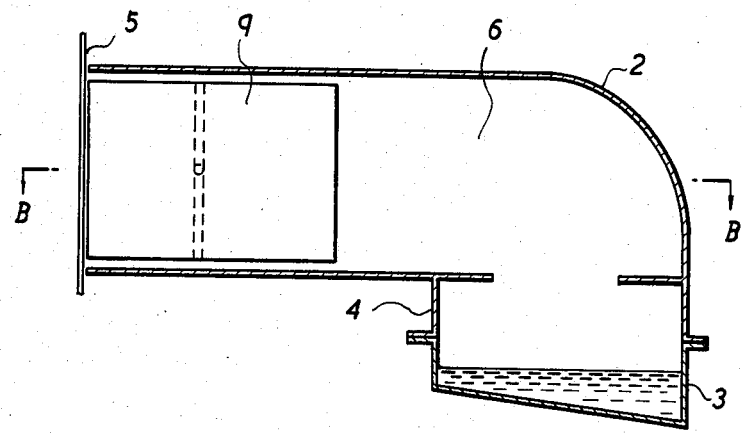
FIG. 7A is a schematic vertical cross-sectional view of another embodiment of the apparatus of this invention and FIG. 7B is a horizontal cross-sectional view along line B-B' in FIG. 7A.
Figure 7B:
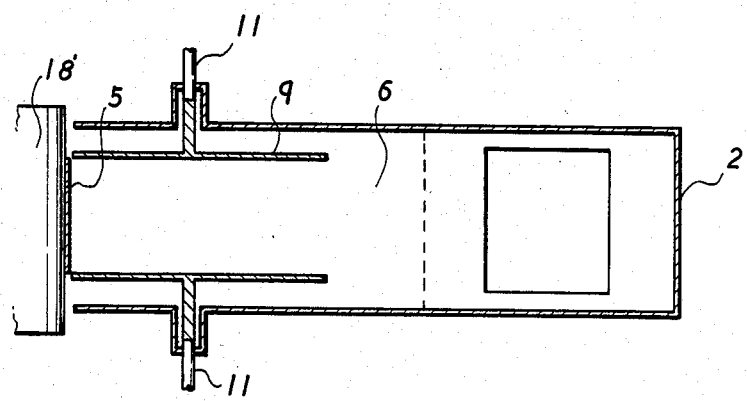

FIGS. 7A and 7B show another embodiment of this invention in a simplified depiction. FIG. 7B is a horizontal cross sectional view along line B-B' in FIG. 7A. In this structure, a metal strip moves vertically passing the opening of the vapor channel and a backing block 18' is used instead of a supporting roll 18. The structure and function are substantially the same as the apparatus of FIGS. 6A and 6B. The same reference numbers stand for the same members as in FIGS. 6A and 6B.

When a metal strip is vacuum-deposition-coated by these apparatuses, the pressure in the vacuum deposition chamber 1 is usually kept slightly lower than or almost the same as that in the evaporation chamber 2. Vapor flow 10 is determined by the amount of the coating to be deposited on the surface of the substrate and the width of the sustrate. The desired vapor flow rate is achieved by regulating the energy (electric power) applied to the heating means of the evaporation bath 4 and aperture of the shutter means 7.

Figure 8A:
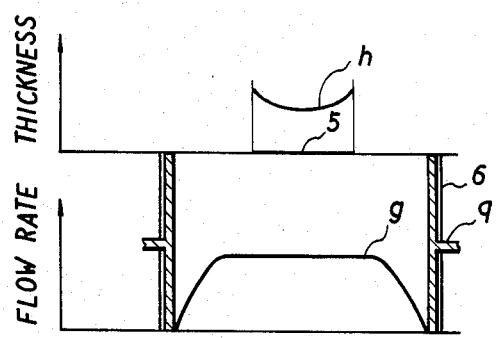
FIGS. 8A, 8B and 8C are schematic representations of vapor flow rate distribution in the vapor channel and thickness distribution in the formed coating film when the apparatus of this invention is used.

Uniform thickness distribution in the formed coating film is achieved by properly regulating the distance between the two control panels. When a substrate is rather thickly coated, that is, deposition is conducted with rather high vapor flow rate, if the control panels 9 remain apart widest as schematically shown in FIG. 8A, the flow velocity distribution is as indicated by curve g, and the thickness distribution of the coated film is as indicated by curve h. In this case, the edge portions of the coated film become thicker influenced by flow contraction.

Figure 8B:
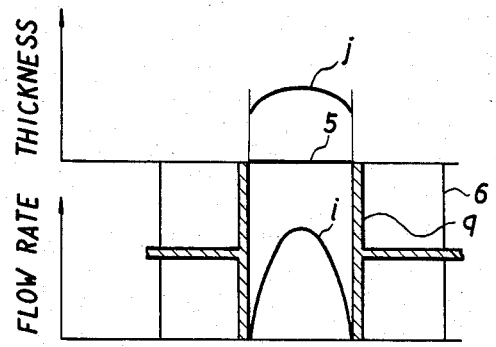

If the control panels are brought closer to the edges of the substrate strip as shown in FIG. 8B, the flow velocity distribution is as indicated by curve i, and the thickness distribution of the coated film is as indicated by curve j. In this case, there is no influence of flow contraction, and the thickness distribution is influenced by flow velocity distribution only.

Figure 8C:
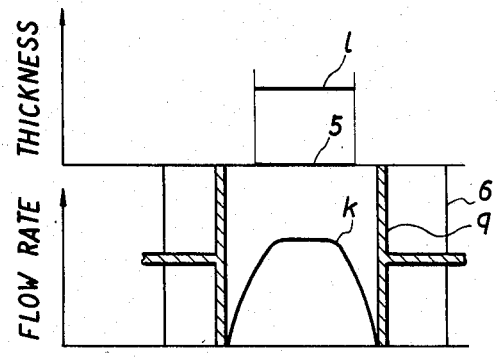

If the control panels are properly positioned as shown in FIG. 8C, a uniform thickness distribution in the coated film is attained as indicated by curve l. In this case, the effect of the side walls and vapor viscosity does not reach so far (since the flow rate is rather high) and the effect is cancelled by the effect of flow contraction.

Proper position (distance) of the control panels 9 can easily be determined by trial and error in a test run. The vapor flow rate is determined in accordance with the coating amount, that is, vapor flow rate=t(strip width)×v(strip speed)×w(coating weight per unit area). The desired vapor flow rate is obtained by regulation of the heating of the evaporation bath and the opening of the shutter means as mentioned above. Working Example A mild steel strip 300 mm in width and 0.6 mm in thickness, which had been subjected to a surface reduction pretreatment, was vacuum-deposition-coated with zinc using an apparatus substantially as shown in FIGS. 6A and 6B. Approximate dimensions of the apparatus were as follows. Horizontal cross section of the evaporation bath: 495 mm×495 mm. Vertical cross section of the vapor channel: 465 mm×450 mm.

Operating conditions were as follows. Degree of evacuation of the vacuum deposition chamber: 0.12 Torr. Molten bath temperature: 510° C. Area of shutter opening: 290 cm$^2$. Coating weight: 50 g/m$^2$.

Figure 9:
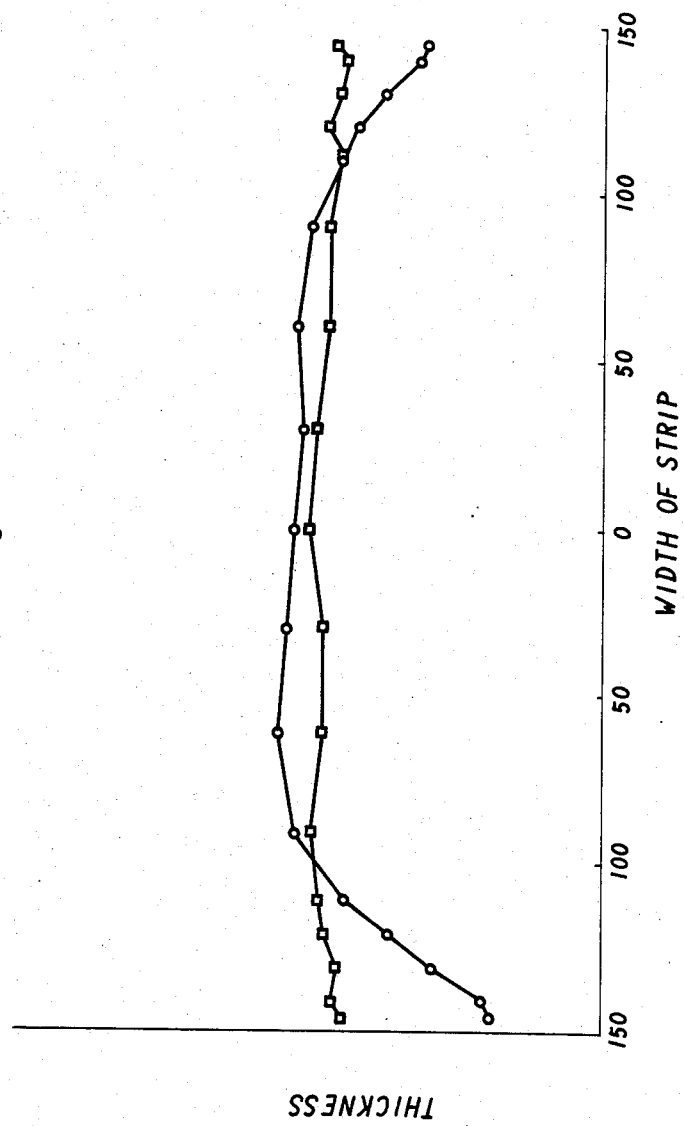
FIG. 9 is a graph showing transversal thickness distribution in the coating film formed by an apparatus of this invention.

The results are shown in FIG. 9. The line with small squares represents the case when the control panels were properly positioned. The line with small circles represents the case when the control panels were positioned too narrow (320 mm in distance). When the uniform thickness distribution was achieved, the distance of the control panels was about 400 mm.

This invention enables to provide a vacuum-deposition-coated metal sheet with transversally uniform thickness of various widths with a single vacuum deposition apparatus. This is very advantageous for improvement in product quality, reduction of production cost and enhancement of productivity. Although the invention was specifically illustrated by way of a working example with respect to coating of steel strip with zinc, it will obviously be applicable to vacuum deposition of aluminum, tin, etc. The substrate is not limited to steel strip.

What we claim is:

1. A continuous vacuum deposition apparatus for coating a metal strip which comprises an evacuable deposition chamber provided with a seal roll system at the entrance and the exit for entering and egressing of the strip and an evaporation chamber which is placed in said evacuable deposition chamber and which further comprises an evaporation bath and a vapor channel which leads the vapor to the surface of the substrate strip, wherein a pair of control panels for varying the width of vapor flow are provided in said vapor channel adjacent to the substrate strip, said control panels respectively comprising a lateral board and an intercepting board perpendicularly secured to said lateral board, said intercepting board being operated by an operation rod secured thereto wherein said control panels have means thereon for preventing leak of the metal vapor through the interstices between each of said control panels and the wall of said vapor channel.

2. The apparatus claimed in claim 1, wherein a supporting roll is provided in the deposition chamber to support and guide the metal strip.

3. The apparatus claimed in claim 1, wherein a backing block is provided in the deposition chamber to support and guide the metal strip.

4. The apparatus claimed in claim 1, wherein a shutter means is provided in the evaporation chamber between the bath part and the channel part.

5. The apparatus claimed in claim 4, wherein the shutter means is a slide shutter.

6. The apparatus claimed in claim 4, wherein the shutter means is a butterfly shutter.

* * * * *

UNITED STATES PATENT AND TRADEMARK OFFICE
CERTIFICATE OF CORRECTION

PATENT NO. : 4,655,168

DATED : April 7, 1987

INVENTOR(S) : Yoshio Shimozato et al.

It is certified that error appears in the above-identified patent and that said Letters Patent is hereby corrected as shown below:

Column 1 Line 23 "20950178" should read --20950/78--.

Column 2 Line 52 "has" should read --gas--.

Column 3 Line 45 "reached" should read --reaches--.

Column 4 Line 68 "1" should read --$\ell$--.

Claim 1 - Column 6 Line 22 Before "means" insert --a--.

Signed and Sealed this

Fifteenth Day of September, 1987

Attest:

DONALD J. QUIGG

*Attesting Officer*     *Commissioner of Patents and Trademarks*